United States Patent
Choi et al.

(10) Patent No.: US 9,685,582 B2
(45) Date of Patent: Jun. 20, 2017

(54) LIGHT EMITTING DEVICE AND METHOD OF FABRICATING THE SAME

(71) Applicant: Seoul Semiconductor Co., Ltd., Ansan-si (KR)

(72) Inventors: Hyuck Jung Choi, Ansan-si (KR); Dae Hee Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/980,438

(22) Filed: Dec. 28, 2015

(65) Prior Publication Data

US 2016/0111591 A1 Apr. 21, 2016

Related U.S. Application Data

(62) Division of application No. 14/319,731, filed on Jun. 30, 2014, now Pat. No. 9,320,108.

(30) Foreign Application Priority Data

Jun. 28, 2013 (KR) .................. 10-2013-0075740
Jun. 28, 2013 (KR) .................. 10-2013-0075742

(51) Int. Cl.
*H01L 33/00* (2010.01)
*H01L 33/50* (2010.01)
(Continued)

(52) U.S. Cl.
CPC .......... *H01L 33/005* (2013.01); *H01L 22/12* (2013.01); *H01L 33/504* (2013.01); *H01L 33/56* (2013.01);
(Continued)

(58) Field of Classification Search
CPC ........ H05B 33/12; H05B 33/10; H05B 33/56; H05B 33/504; H05B 2933/005; H05B 2933/0041

See application file for complete search history.

(56) References Cited

U.S. PATENT DOCUMENTS

| 2006/0073625 A1 | 4/2006 | Harada |
| 2007/0096113 A1 | 5/2007 | Inoshita et al. |

(Continued)

FOREIGN PATENT DOCUMENTS

| EP | 2525419 | 11/2012 |
| JP | 2009-260244 | 11/2009 |

(Continued)

OTHER PUBLICATIONS

European Search Report issued on Oct. 8, 2014, in European Patent Application No. 14174867.3.

(Continued)

*Primary Examiner* — Anne Hines
(74) *Attorney, Agent, or Firm* — H.C. Park & Associates, PLC

(57) ABSTRACT

A method of fabricating a light-emitting device, the method including forming a first resin comprising a phosphor inside a cavity of a package body on which a light-emitting diode chip is mounted, measuring color coordinates of light emitted by combination of the light-emitting diode chip and the phosphor, and correcting the color coordinates by forming a second resin on the first resin. The first resin is not fully cured before measuring and correcting the color coordinates.

18 Claims, 7 Drawing Sheets

(51) Int. Cl.
  *H01L 33/56* (2010.01)
  *H05B 33/10* (2006.01)
  *H05B 33/12* (2006.01)
  *H01L 21/66* (2006.01)
(52) U.S. Cl.
  CPC .............. *H05B 33/10* (2013.01); *H05B 33/12* (2013.01); *H01L 2933/005* (2013.01); *H01L 2933/0033* (2013.01); *H01L 2933/0041* (2013.01)

(56) References Cited

U.S. PATENT DOCUMENTS

| | | | |
|---|---|---|---|
| 2010/0044735 A1 | 2/2010 | Oyamada | |
| 2010/0090231 A1 | 4/2010 | Jung et al. | |
| 2010/0155763 A1* | 6/2010 | Donofrio | H01L 33/50 257/98 |
| 2012/0305970 A1 | 12/2012 | Kim | |
| 2013/0194783 A1 | 8/2013 | Kang | |

FOREIGN PATENT DOCUMENTS

| | | |
|---|---|---|
| JP | 2012-174968 | 9/2012 |
| JP | 2012-227413 | 11/2012 |
| WO | 2009/028861 | 3/2009 |

OTHER PUBLICATIONS

Non-Final Office Action mailed on Aug. 8, 2015 in U.S. Appl. No. 14/319,731.

* cited by examiner

LIGHT EMITTING DEVICE AND METHOD OF FABRICATING THE SAME

CROSS-REFERENCE TO RELATED APPLICATIONS

This application is a divisional of U.S. patent application Ser. No. 14/319,731, filed on Jun. 30, 2014, and claims priority from and the benefit of Korean Patent Application Nos. 10-2013-0075740, filed on Jun. 28, 2013, and 10-2013-0075742, filed on Jun. 28, 2013, which are hereby incorporated by reference for all purposes as if fully set forth herein.

BACKGROUND

Field

Exemplary embodiments of the present invention relate to a method of fabricating a light emitting device and, more particularly, to correction of color coordinates (or color temperature) of a light emitting device.

Description of the Background

Light emitting devices using a light emitting diode as a light source may be widely used in various fields due to advantages of low power consumption and long lifespan. Particularly, since the light emitting device may realize a mixed color, that is, white light, through combination of a light emitting diode and phosphors, the light emitting device may be used as a backlight source of a liquid crystal display and as various kinds of light sources for illumination.

A plurality of light emitting diode chips may be fabricated from a single wafer through the same process, and phosphors may be coated onto the light emitting diode chips at wafer level or chip level, or contained in a molding resin at package level and disposed on the light emitting diode chips. A color of certain color coordinates may be realized by mixing light emitted from the light emitting diode chip with light emitted from the phosphors. Thus, combinations of light emitting diode chips and phosphors may be determined so as to realize desired color coordinates during fabrication of a light emitting device.

Light emitting devices may be produced by the same process described above. For example, a number of light emitting diode chips having the same characteristics may be produced by the same process, and a molding resin containing the same kind and concentration of phosphors may be deposited on these light emitting diode chips. Since these light emitting devices may be produced by the same process so as to exhibit desired color coordinates, these light emitting devices may be expected to exhibit the same color coordinates. However, a process margin occurring in each process step may cause dispersion of color coordinates even though the light emitting devices are produced through the same process.

FIG. 1 is a graph depicting distribution of color coordinates of light emitting devices produced through the same process.

Herein, the graph shows distribution of color coordinates of a plurality of light emitting devices produced using blue light emitting diode chips and yellow phosphors. Rectangular boxes on the color coordinates indicate target ranges of color coordinates represented by bin codes.

Since a single kind of yellow phosphors is used, the light emitting devices may exhibit dispersion of yellow color coordinates over a region where blue color coordinates are relatively strong. Among the light emitting devices having such a distribution of color coordinates, light emitting devices within target bin codes may be chosen as good products and other light emitting devices are discarded as defective products.

The above information disclosed in this Background section is only for enhancement of understanding of the background of the invention and therefore it may contain information that does not form any part of the prior art nor what the prior art may suggest to a person of ordinary skill in the art.

SUMMARY OF THE INVENTION

Exemplary embodiments of the present invention relate to improving yield of light emitting devices through correction of color coordinates into a desired target bin.

Exemplary embodiments of the present invention also relate to providing a light emitting device having color coordinates corrected within a desired target bin.

Additional features of the invention will be set forth in the description which follows, and in part will be apparent from the description, or may be learned by practice of the invention.

An exemplary embodiment of the present invention relates to a light emitting device including: a package body having a cavity; a light emitting diode chip disposed within the cavity; and a wavelength conversion section disposed on the light emitting diode chip, wherein the wavelength conversion section includes first phosphors and second phosphors mixed with a transparent resin, and the second phosphors are disposed on the first phosphors deposited around the light emitting diode chip.

The first and second phosphors may be different kinds of phosphors.

The first and second phosphors may be the same kind of phosphor.

The package body may include lead electrodes, and the lead electrodes may be electrically connected to the light emitting diode chip.

The cavity may be completely filled with the transparent resin.

Each of the first and second phosphors in the transparent resin may be present in a concentration gradually decreasing towards an upper surface of the transparent resin.

An exemplary embodiment of the present invention also discloses a light emitting device including: a package body having a cavity; a light emitting diode chip disposed within the cavity; a first resin covering the light emitting diode chip and formed to a predetermined height in the cavity; and a second resin disposed on the first resin.

The first resin may include first phosphors and the second resin may include second phosphors.

The first phosphor may settle around the light emitting diode chip and the second phosphor may deposit around an upper surface of the first resin.

The package body may include lead electrodes, and the lead electrodes may be electrically connected to the light emitting diode chip.

The first and second phosphors may be the same kind of phosphor.

The first and second phosphors may be different kinds of phosphors.

The first phosphors of the first resin may be present in a concentration gradually decreasing towards an upper surface of the first resin.

The second phosphors of the second resin may be present in a concentration gradually decreasing towards an upper surface of the second resin.

An exemplary embodiment of the present invention also discloses a method of fabricating a light emitting device including: forming a first resin containing phosphors inside a cavity of a package body on which a light emitting diode chip is mounted; measuring color coordinates of light emitted by combination of the light emitting diode chip and the first resin; and correcting the color coordinates by forming a second resin on the first resin.

Correction of the color coordinates may include mixing a phosphor-containing or phosphor-free second resin with the first resin.

The first and second resins may contain the same kind of phosphor.

The first and second resins may contain different kinds of phosphors.

Forming the first resin may further include: depositing the first resin on the light emitting diode chip, followed by leaving the first resin for 30 minutes or more to allow the phosphors to settle around the light emitting diode chip.

The method may further include semi-curing the first resin after forming the first resin.

According to embodiments of the present invention, it is possible to improve yield of light emitting devices through correction of color coordinates within a target bin range.

In addition, the present invention can simplify correction of the color coordinates by forming a first resin on a light emitting diode chip, measuring and correcting the color coordinate, and curing the first resin, instead of curing the first resin immediately after the first resin is formed on the light emitting diode chip.

Further, the present invention can simplify correction of the color coordinates by forming a first resin to a predetermined height within a cavity, semi-curing the first resin, measuring the color coordinates, and forming a second resin on the first resin to correct the color coordinates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
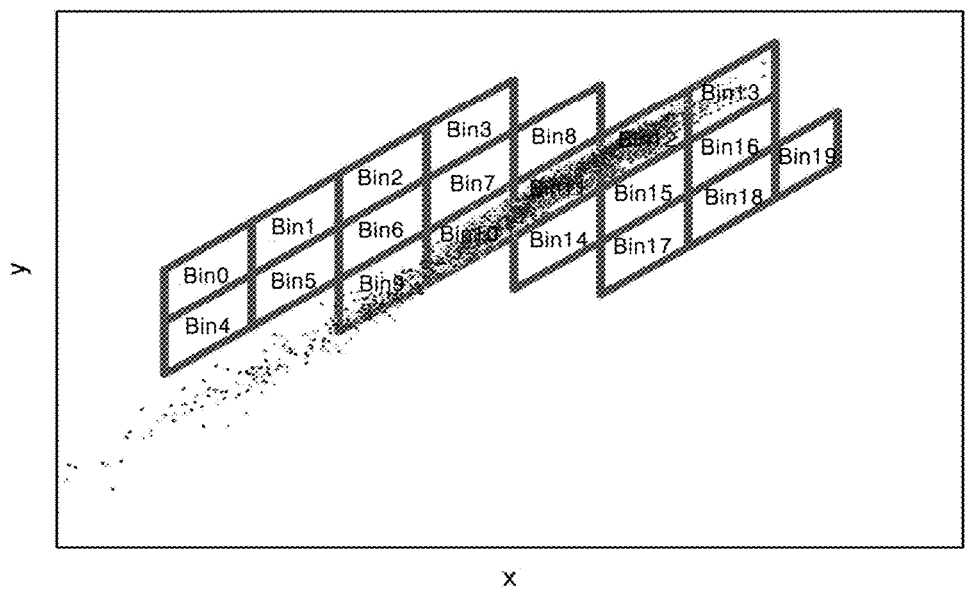
FIG. 1 is a graph depicting distribution of color coordinates of light emitting devices produced by the same process.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
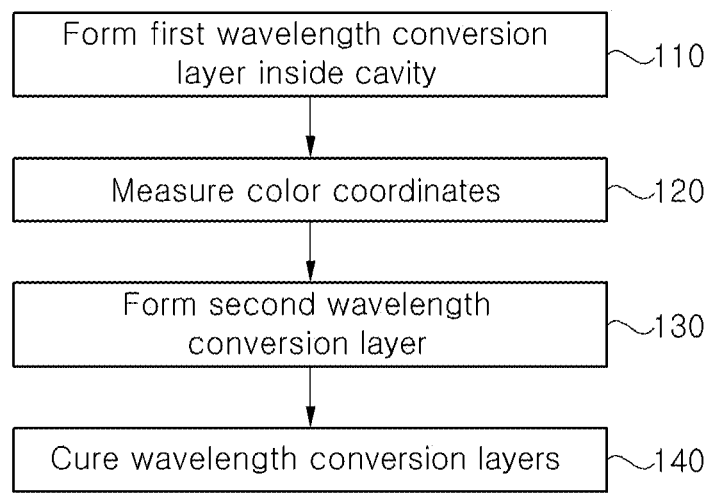
FIG. 2 is a flowchart of a method of fabricating a light emitting device according to an exemplary embodiment of the present invention.
Figure 3:
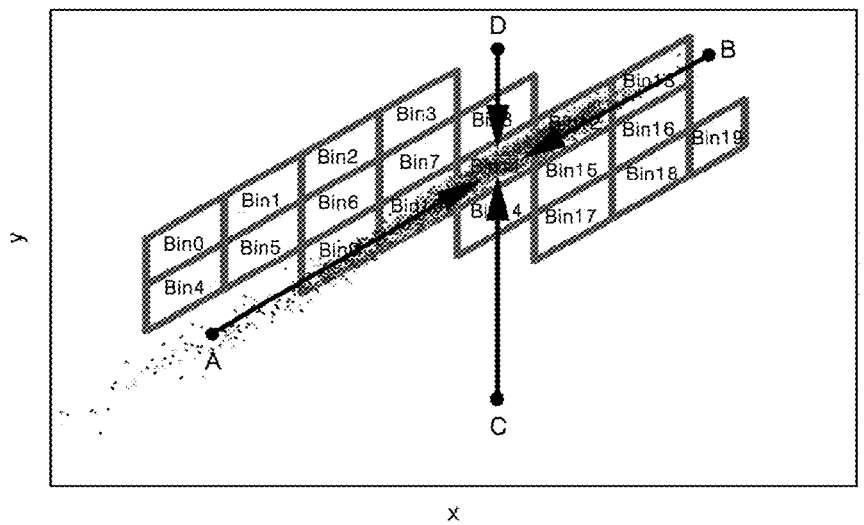
FIG. 3 is a graph depicting a method of correcting color coordinates according to an exemplary embodiment of the present invention.

FIG. 2 is a flowchart of a method of fabricating a light emitting device according to an exemplary embodiment of the present invention, FIG. 3 is a graph depicting a method of correcting color coordinates according to an exemplary embodiment present invention, and FIG. 4 to FIG. 9 are sectional views illustrating the method of fabricating the light emitting device according to an exemplary embodiment of the present invention.

As shown in FIG. 2, in the method of fabricating a light emitting device according to an exemplary embodiment of the invention, in step 110, a first resin containing phosphors is formed within a cavity of a package body, on which a light emitting diode chip is mounted. Here, after the first resin is formed within the cavity, a curing process is omitted in step 110.

In step 120, color coordinates of the light emitting device having the first resin formed therein are measured. Here, step 120 may be delayed for a predetermined period of time such that phosphors of the first resin settle around the light emitting diode chip. For example, second step 120 may be started after about 30 minutes to 1 hour from completion of step 110.

In step 130, a phosphor-containing or phosphor-free second resin is mixed with the first resin to correct the measured color coordinates.

According to the present exemplary embodiment, when the color coordinates deviate from a target bin, the phosphor-containing or phosphor-free second resin may be mixed with the first resin to correct the color coordinates.

In step 140, both the first and second resins are cured through a curing process, thereby completing formation of a wavelength conversion section.

According to the present exemplary embodiment, the color coordinates of the first resin are measured without curing the first resin, and the curing process is carried out after correction of the color coordinates deviating from the target bin, thereby improving yield of light emitting devices.

The method of fabricating a light emitting device according to an exemplary embodiment of the present invention will be described in more detail with reference to FIG. 2 to FIG. 9.

Figure 4:
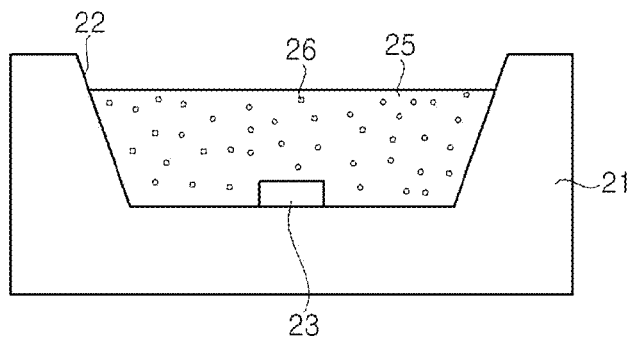
FIG. 4 to FIG. 9 are sectional views illustrating the method of fabricating the light emitting device according to an exemplary embodiment of the present invention.

Referring to FIG. 2 and FIG. 4, a first resin 25 is formed on a light emitting diode chip 23 mounted on a package body 21. The package body 21 may have a cavity 22 and the light emitting diode chip 23 may be mounted on a bottom surface of the cavity 22. The package body 21 is provided with lead electrodes (not shown) and the light emitting diode chip 23 is electrically connected to the lead electrodes.

The first resin 25 may be formed to a predetermined height within the cavity 22. That is, some of the cavity 22 may not be filled with the first resin 25.

The first resin 25 may be formed by depositing a molding resin containing first phosphors 26 inside the cavity 22 of the package body 21 using a dispenser. Alternatively, the first resin 25 may be formed inside the cavity 22 using various molding methods. The first resin 25 covers the light emitting diode chip 23.

Figure 5:
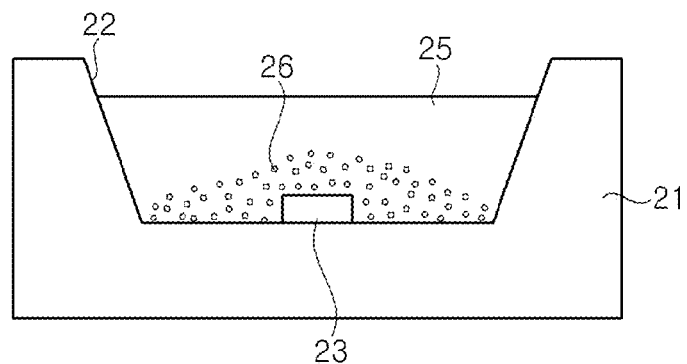

Referring to FIG. 2 and FIG. 5, after the first phosphors 26 settle around the light emitting diode chip 23 for a predetermined period of time, the light emitting diode chip 23 is operated to measure color coordinates. As a result, a degree of deviation of the color coordinates from the target bin can be confirmed.

Figure 6:
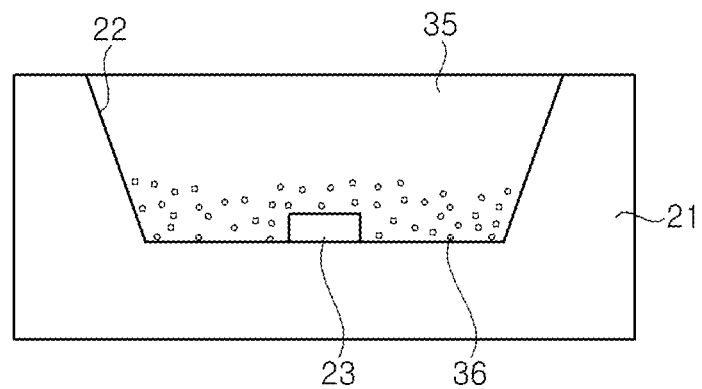

Referring to FIG. 2, FIG. 3 and FIG. 6, for the light emitting device, the color coordinates of which deviate from the target bin, a phosphor-free second resin is mixed with the first resin 25 (see FIG. 5). In the present exemplary embodiment, when the measured color coordinates are placed at point B, the phosphor-free second resin is mixed with the first resin to reduce the concentration of second phosphors 36 placed around the light emitting diode chip 23 such that the color coordinates are shifted into the target bin.

Here, the second resin is mixed with the first resin, whereby the cavity 22 can be completely filled with a wavelength conversion section 35. Further, the first phosphors 26 may be present in a concentration gradually decreasing from the light emitting diode chip 23 towards an upper surface of the first resin.

Figure 7:
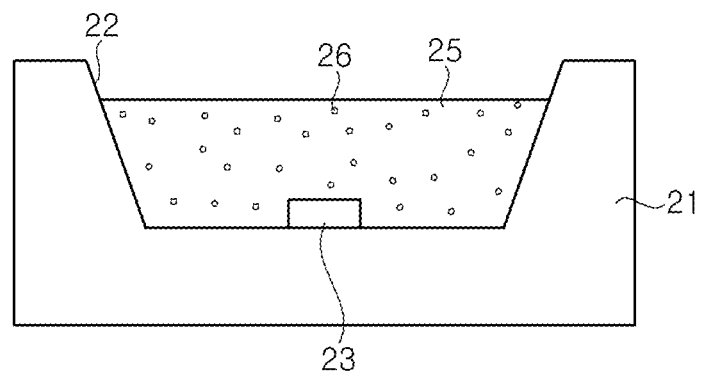

Referring to FIG. 2 and FIG. 7, a first resin 25 is formed on a light emitting diode chip 23 mounted on a package body 21. The package body 21 may have a cavity 22 and the light emitting diode chip 23 may be mounted on the bottom surface of the cavity 22. The package body 21 is provided with lead electrodes (not shown) and the light emitting diode chip 23 is electrically connected to the lead electrodes.

The first resin 25 may be formed by depositing a molding resin containing first phosphors 26 inside the cavity 22 of the package body 21 using a dispenser. Alternatively, the first resin 25 may be formed inside the cavity 22 using various molding methods. The first resin 25 covers the light emitting diode chip 23.

Figure 8:
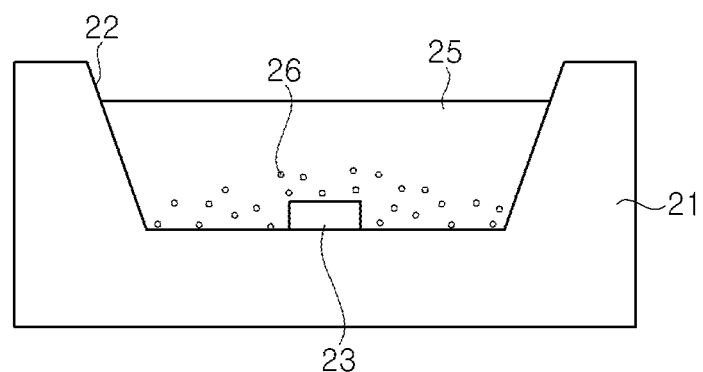

Referring to FIG. 2 and FIG. 8, after the first phosphors 26 settle around the light emitting diode chip 23 for a predetermined period of time, the light emitting diode chip 23 is operated to measure color coordinates. As a result, a degree of deviation of the color coordinates from the target bin can be confirmed.

Figure 9:
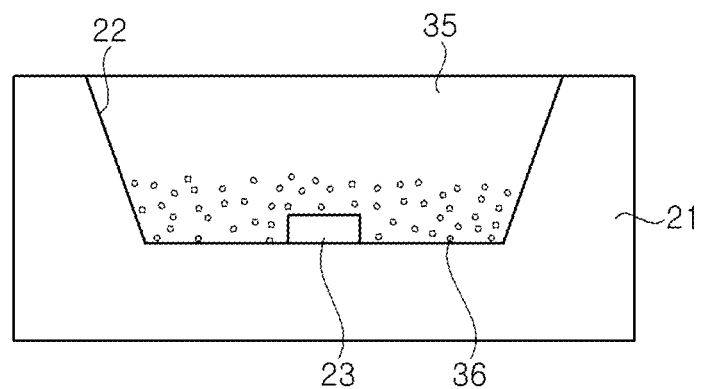

Referring to FIG. 2, FIG. 3 and FIG. 9, for the light emitting device, the color coordinates of which deviate from the target bin, a phosphor-containing second resin is mixed with the first resin 25 (see FIG. 8) to form a wavelength conversion section 35. According to the present exemplary embodiment, when the measured color coordinates are placed at point A, the phosphor-containing second resin is mixed with the first resin to increase the concentration of second phosphors 36 placed around the light emitting diode chip 23 such that the color coordinates are shifted into the target bin. Here, the phosphors contained in the second resin may be the same kind as the first phosphors 26 (FIG. 8) in the first resin 25 (FIG. 8).

As described above, the color coordinates of the first resin are measured without curing the first resin, and when the color coordinates deviate from the target bin, a molding resin containing or not containing the phosphors is mixed with the first resin to correct the color coordinates, followed by performing the curing process, thereby improving yield of light emitting devices.

On the other hand, when the color coordinates measured in step 120 are placed at point C or D, a molding resin containing phosphors suited for correction of the color coordinates may be mixed with the first resin. When the first resin contains two or more kinds of phosphors, the color coordinates generally deviate from the target bin and are placed at point C or D. In this case, the color coordinates may be shifted into the target bin using the same phosphors as the phosphors contained in the first resin while adjusting the concentrations of these phosphors, or by mixing different phosphors than the phosphors contained in the first resin.

Figure 10:
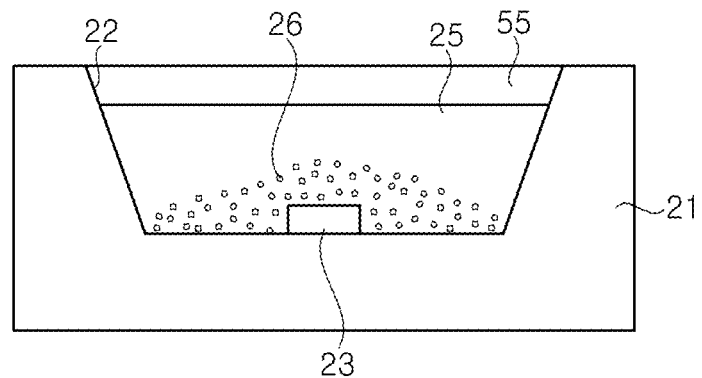
FIG. 10 is a sectional view of a light emitting device according to an exemplary embodiment of the present invention.

FIG. 10 is a sectional view of a light emitting device according to an exemplary embodiment of the present invention.

As shown in FIG. 10, in the light emitting device according to the present exemplary embodiment, a first resin 25 is formed to a predetermined height within a cavity 22 of a package body 21 on which a light emitting diode chip 23 is mounted. The first resin 25 contains first phosphors 26.

Color coordinates of the light emitting device are measured without curing the first resin 25. Here, since the first resin 25 is maintained without being subjected to curing for a predetermined period of time after formation of the first resin 25, the first phosphors 26 can settle around the light emitting diode chip 23.

When the measured color coordinates are placed within a target bin, the first resin 25 is subjected to curing without a separate correction step, and then, a molding section 55 may be formed using a silicone resin on the first resin 25. The molding section 55 completely fills the cavity such that an upper surface of the molding section becomes coplanar with an upper surface of the package body 21.

In the present exemplary embodiment, the molding section 55 is illustrated as being formed on the first resin 25 when the measured color coordinates are placed within the target bin. However, the molding section 55 may be omitted.

Figure 11:
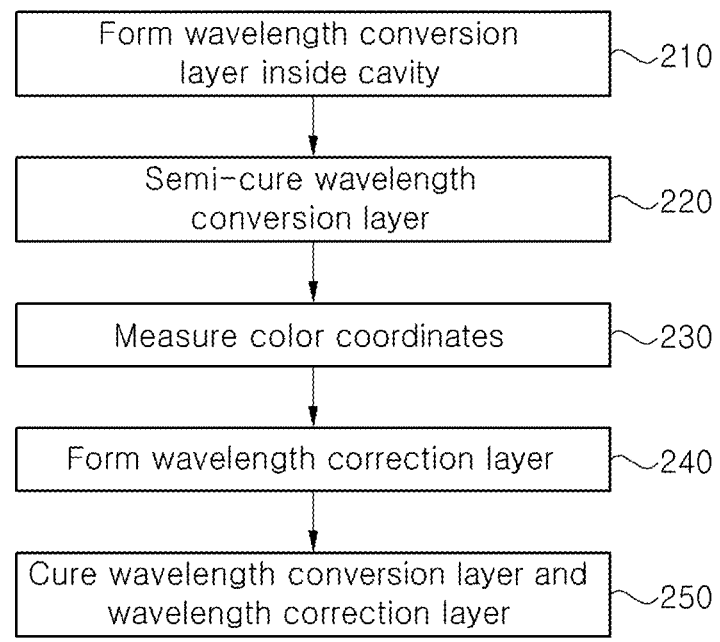
FIG. 11 is a flowchart of a method of fabricating a light emitting device according to an exemplary embodiment of the present invention.

FIG. 11 is a flowchart of a method of fabricating a light emitting device according to an exemplary embodiment of the present invention, and FIG. 12 to FIG. 18 are sectional views illustrating a method of fabricating the light emitting device according to the present exemplary embodiment.

As shown in FIG. 11, in the method according to the present exemplary embodiment, in step 210, a first resin is formed within a cavity of a package body, on which a light emitting diode chip is mounted. Here, the first resin is formed to a predetermined height within the cavity. That is, an upper region of the cavity may be exposed from the first resin.

In step 220, the first resin is semi-cured. Here, the first resin may be semi-cured at a predetermined temperature for a predetermined period of time. That is, step 220 is a process of semi-curing the first resin instead of completely curing the first resin.

In step 230, color coordinates of the light emitting device having the first resin formed therein are measured.

In step 240, a phosphor-containing or phosphor-free second resin is formed on the first resin to correct the measured color coordinates.

According to the present exemplary embodiment, when the color coordinates deviate from a target bin, the phosphor-containing or phosphor-free second resin may be formed on the first resin to correct the color coordinates.

In step 250, both the first and second resins are cured through a curing process, thereby completing formation of a wavelength conversion section.

According to the present exemplary embodiment, after the first resin is semi-cured to a predetermined height within the cavity, the color coordinates of the first resin are measured and corrected using the second resin, thereby improving yield of light emitting devices.

Figure 12:
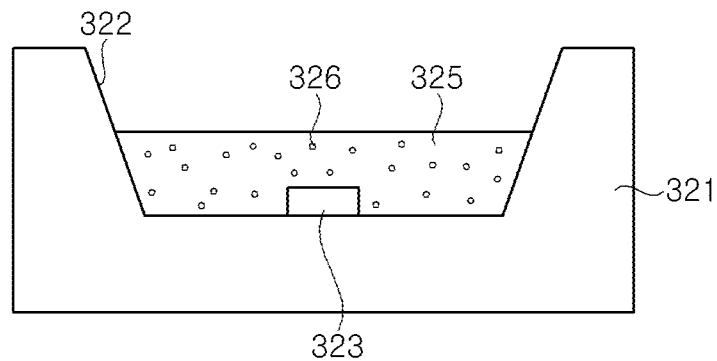
FIG. 12 to FIG. 18 are sectional views illustrating a method of fabricating the light emitting device according to an exemplary embodiment of the present invention.

Referring to FIG. 11 and FIG. 12, a first resin 325 is formed on a light emitting diode chip 323 mounted on a package body 321. The package body 321 may have a cavity 322 and the light emitting diode chip 323 may be mounted on a bottom surface of the cavity 322. The package body 321 is provided with lead electrodes (not shown) and the light emitting diode chip 323 is electrically connected to the lead electrodes.

The first resin 325 covers the light emitting diode chip 323. The first resin 325 may be formed by depositing a molding resin containing first phosphors 326 inside the cavity 322 of the package body 321 using a dispenser. Alternatively, the first resin 325 may be formed inside the cavity 322 using various molding methods. The first resin 325 covers the light emitting diode chip 323.

The first resin 325 is formed to a predetermined height in the cavity and an upper portion of the cavity 322 is partially exposed from the first resin 325.

Figure 13:
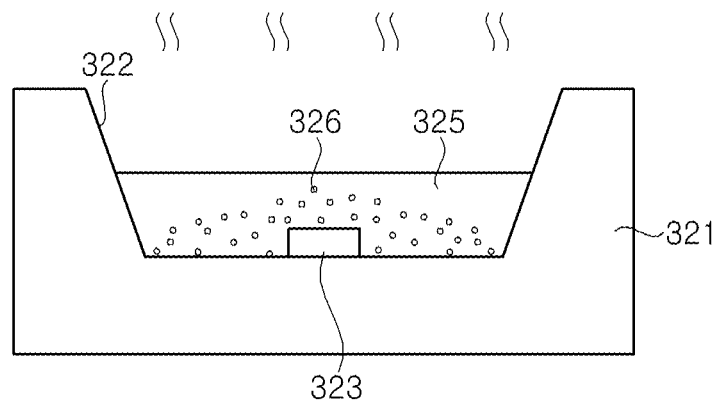

Referring to FIG. 11 and FIG. 13, the first resin 325 is semi-cured at a predetermined temperature for a predetermined period of time.

Figure 14:
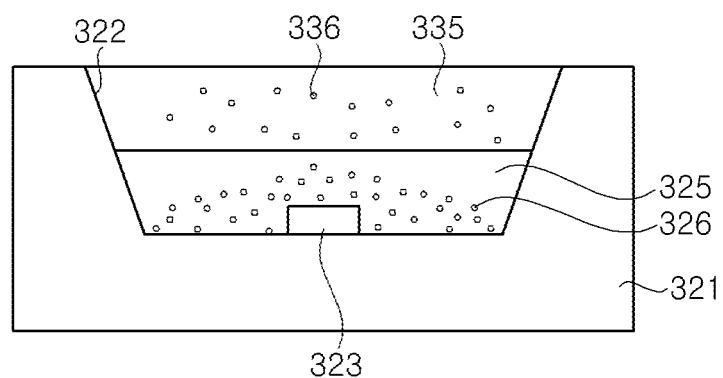

Referring to FIG. 11, FIG. 3 and FIG. 14, a second resin 335 is formed on the first resin 325. The second resin 335 contains second phosphors 336 and may be deposited inside the cavity 322 of the package body 321 using a dispenser.

When the color coordinates of the light emitting device are placed at point A, that is, outside the target bin, the second resin containing the second phosphors 336 is formed on the first resin 325 to increase the concentration of the phosphors within the cavity 322, thereby shifting the color coordinates into the target bin.

Figure 15:
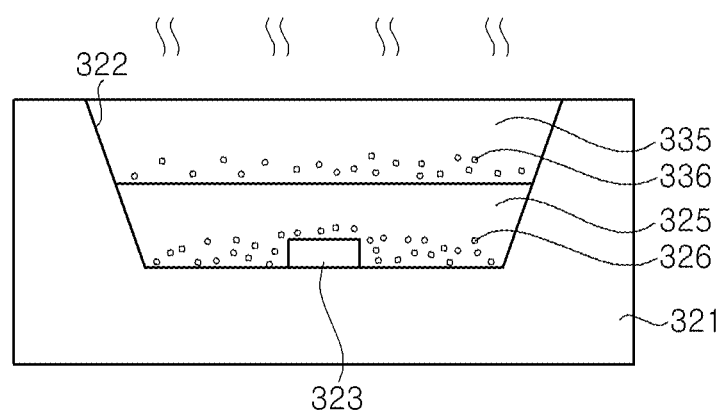

Referring to FIG. 11 and FIG. 15, the first resin 325 and the second resin 335 are cured to complete formation of the wavelength conversion section. Here, the first and second phosphors settle over a predetermined period of time. As a result, the concentration of the first phosphors 326 gradually decreases towards an upper surface of the first resin 325 and the concentration of the second phosphors 336 gradually decreases towards an upper surface of the second resin 335.

As described above, according to the present exemplary embodiment, the color coordinates are measured after the first resin 325 is formed to a predetermined height within the cavity and semi-cured, and the second resin 335 is then formed on the first resin 325 to correct the color coordinates, followed by curing, thereby improving yield of light emitting devices.

Figure 16:
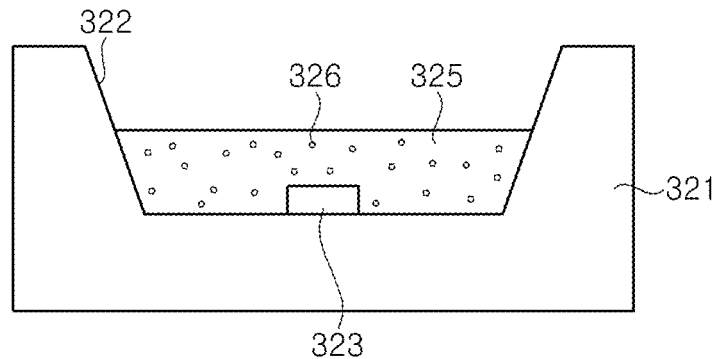

Referring to FIG. 11 and FIG. 16, a first resin 325 is formed on a light emitting diode chip 323 mounted on a package body 321.

The first resin 325 is a molding resin containing first phosphors 326 and may be formed by depositing the molding resin inside a cavity 322 of the package body 321 using a dispenser. Alternatively, the first resin 325 may be formed inside the cavity 322 using various molding methods. The first resin 325 covers the light emitting diode chip 323.

The first resin 325 is formed to a predetermined height in the cavity, and an upper portion of the cavity 322 is partially exposed from the first resin 325.

Figure 17:
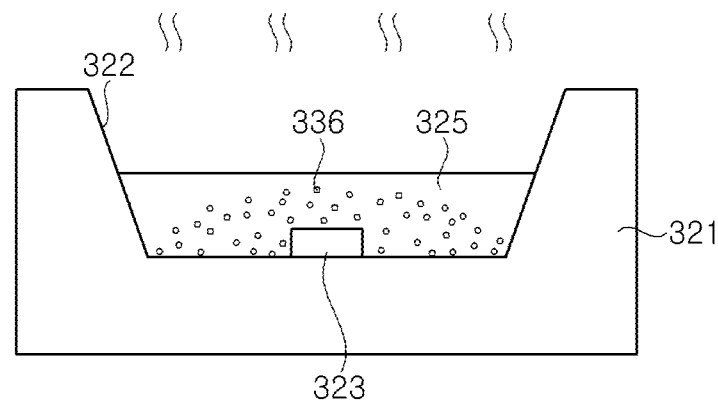

Referring to FIG. 11 and FIG. 17, the first resin 325 is semi-cured at a predetermined temperature for a predetermined period of time.

Figure 18:
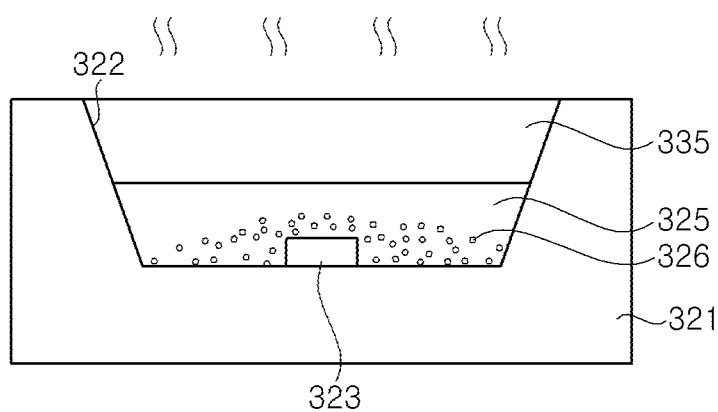

Referring to FIG. 11, FIG. 3 and FIG. 18, a second resin 335 is formed on the semi-cured first resin 325. The second resin 335 is a phosphor-free molding resin and is formed by depositing the phosphor-free molding resin inside the cavity 322 of the package body 321 using a dispenser.

When the color coordinates of the light emitting device are placed at point B, that is, outside the target bin, the phosphor-free second resin 335 is formed on the first resin 325 to increase the concentration of phosphors within the cavity 322 such that the color coordinates are shifted into the target bin.

After correction of the color coordinates, the first resin 325 and the second resin 335 are cured to complete formation of the wavelength conversion section.

As described above, according to the present exemplary embodiment, the color coordinates are measured after the first resin 325 is formed to a predetermined height within the cavity and semi-cured, and the second resin 335 is then formed on the first resin 325 to correct the color coordinates, followed by curing, thereby improving yield of light emitting devices.

On the other hand, when the color coordinates measured in step 230 are placed at point C or D, a molding resin containing phosphors suited to correction of the color coordinates may be mixed with the first resin. When the first resin contains two or more kinds of phosphors, the color coordinates generally deviate from the target bin and are placed at point C or D. In this case, the color coordinates may be shifted into the target bin using the same phosphors as the phosphors contained in the first resin while adjusting the concentrations of these phosphors, or by mixing different phosphors than the phosphors contained in the first resin.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a light-emitting device, the method comprising:
   forming a first resin comprising a phosphor inside a cavity of a package body on which a light-emitting diode chip is mounted;
   measuring color coordinates of light emitted by combination of the light-emitting diode chip and the phosphor;
   correcting the color coordinates by forming a second resin on the first resin; and
   curing the first resin and the second resin after correcting the color coordinates,
   wherein the first resin is not fully cured before measuring and correcting the color coordinates.

2. The method of claim 1, wherein correcting the color coordinates comprises mixing a phosphor-containing or phosphor-free second resin with the first resin.

3. The method of claim 1, wherein the first and second resins are the same material.

4. The method of claim 1, wherein the first and second resins are different materials.

5. The method of claim 1, wherein forming the first resin comprises:
   depositing the first resin on the light-emitting diode chip; and
   allowing the phosphor of the first resin to settle around the light-emitting diode chip after depositing the first resin on the light-emitting diode chip.

6. The method of claim 5, wherein the phosphor is allowed to settle for at least 30 minutes.

7. The method of claim 5, wherein the concentration of the phosphor gradually decreases towards an upper surface of the first resin.

8. The method of claim 1, further comprising partially curing the first resin after forming the first resin on the light-emitting diode chip.

9. The method of claim 8, further comprising fully curing the first resin and the second resin after correcting the color coordinates.

10. The method of claim 1, wherein an upper portion of the cavity is partially exposed from the first resin.

11. The method of claim 10, wherein the second resin is formed on the first resin in the cavity such that a molding section becomes coplanar with an upper surface of the cavity.

12. A method of fabricating a light-emitting device, the method comprising:
    depositing a first resin comprising a phosphor inside a cavity of a package body on which a light-emitting diode chip is mounted;
    allowing the phosphor of the first resin to settle around the light-emitting diode chip after depositing the first resin on the light-emitting diode chip;
    measuring color coordinates of light emitted by combination of the light emitting diode chip and the phosphor; and
    correcting the color coordinates by forming a second resin on the first resin,
    wherein the concentration of the phosphor gradually decreases towards an upper surface of the first resin.

13. The method of claim 12, wherein correcting the color coordinates comprises mixing a phosphor-containing or phosphor-free second resin with the first resin.

14. The method of claim 12, further comprising curing the first resin and the second resin after correcting the color coordinates.

15. The method of claim 12, wherein the phosphor is allowed to settle for at least 30 minutes.

16. The method of claim 12, further comprising partially curing the first resin after forming the first resin on the light-emitting diode chip.

17. The method of claim 16, further comprising fully curing the first resin and the second resin after correcting the color coordinates.

18. A method of fabricating a light-emitting device, the method comprising:
    forming a first resin comprising a phosphor inside a cavity of a package body on which a light-emitting diode chip is mounted;
    measuring color coordinates of light emitted by combination of the light-emitting diode chip and the phosphor; and
    correcting the color coordinates by mixing a phosphor-containing or phosphor-free second resin with the first resin,
    wherein the first resin is not fully cured before measuring and correcting the color coordinates.

* * * * *

(12) EX PARTE REEXAMINATION CERTIFICATE (11666th)
United States Patent
Choi et al.

(10) Number: US 9,685,582 C1
(45) Certificate Issued: Apr. 3, 2020

(54) LIGHT EMITTING DEVICE AND METHOD OF FABRICATING THE SAME

(71) Applicant: Seoul Semiconductor Co., Ltd., Ansan-si (KR)

(72) Inventors: Hyuck Jung Choi, Ansan-si (KR); Dae Hee Kim, Ansan-si (KR)

(73) Assignee: SEOUL SEMICONDUCTOR CO., LTD., Danwon-Gu, Gyeonggi-Do, Ansan-si (KR)

Reexamination Request:
No. 90/014,231, Nov. 2, 2018

Reexamination Certificate for:
Patent No.: 9,685,582
Issued: Jun. 20, 2017
Appl. No.: 14/980,438
Filed: Dec. 28, 2015

Related U.S. Application Data

(62) Division of application No. 14/319,731, filed on Jun. 30, 2014, now Pat. No. 9,320,108.

(30) Foreign Application Priority Data

Jun. 28, 2013 (KR) .......................... 10-2013-0075740
Jun. 28, 2013 (KR) .......................... 10-2013-0075742

(51) Int. Cl.
*H01L 33/00* (2010.01)
*H05B 33/10* (2006.01)

(52) U.S. Cl.
CPC .................................... *H05B 33/10* (2013.01)

(58) Field of Classification Search
None
See application file for complete search history.

(56) References Cited

To view the complete listing of prior art documents cited during the proceeding for Reexamination Control Number 90/014,231, please refer to the USPTO's public Patent Application Information Retrieval (PAIR) system under the Display References tab.

*Primary Examiner* — Fred O Ferris, III

(57) ABSTRACT

A method of fabricating a light-emitting device, the method including forming a first resin comprising a phosphor inside a cavity of a package body on which a light-emitting diode chip is mounted, measuring color coordinates of light emitted by combination of the light-emitting diode chip and the phosphor, and correcting the color coordinates by forming a second resin on the first resin. The first resin is not fully cured before measuring and correcting the color coordinates.

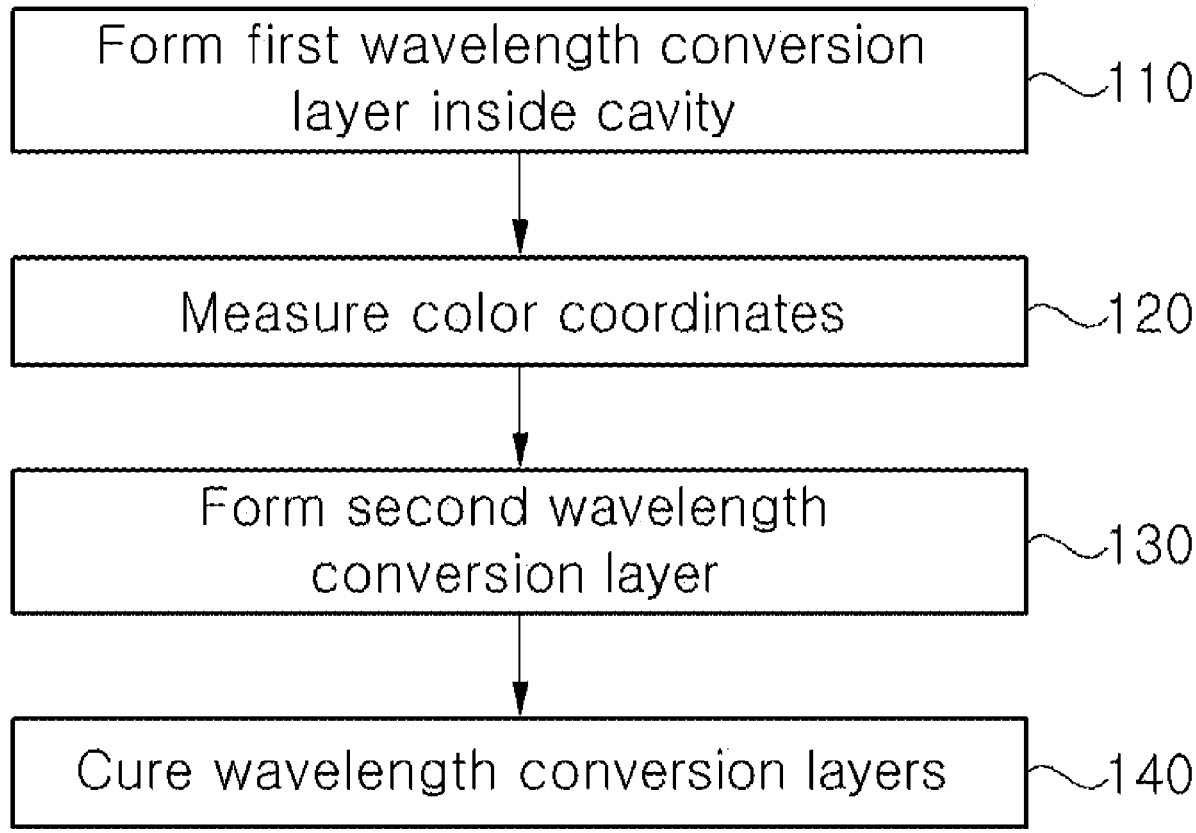

EX PARTE REEXAMINATION CERTIFICATE

THE PATENT IS HEREBY AMENDED AS INDICATED BELOW.

AS A RESULT OF REEXAMINATION, IT HAS BEEN DETERMINED THAT:

Claims 1-3, 5, 7-10, 12-16 and 18 are cancelled.

Claims 4, 6, 11 and 17 were not reexamined.

\* \* \* \* \*